United States Patent
Yanaka et al.

(10) Patent No.: US 6,884,560 B2
(45) Date of Patent: Apr. 26, 2005

(54) LITHOGRAPHIC PRINTING PLATE PRECURSOR

(75) Inventors: Hiromitsu Yanaka, Shizuoka (JP); Kazuo Maemoto, Shizuoka (JP); Keiji Akiyama, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 0 days.

(21) Appl. No.: 09/984,942

(22) Filed: Oct. 31, 2001

(65) Prior Publication Data

US 2002/0102488 A1 Aug. 1, 2002

(30) Foreign Application Priority Data

Nov. 1, 2000   (JP) ........................................ 2000-334824

(51) Int. Cl.$^7$ .............................................. G03F 7/004
(52) U.S. Cl. ................. 430/138; 430/270.1; 430/281.1; 430/286.1; 430/287.1; 430/302; 430/964
(58) Field of Search .............................. 430/138, 270.1, 430/281.1, 286.1, 287.1, 302, 141, 964

(56) References Cited

U.S. PATENT DOCUMENTS

| | | | | |
|---|---|---|---|---|
| 5,055,372 A | * | 10/1991 | Shanklin et al. ............ | 430/138 |
| 5,695,550 A | * | 12/1997 | Marx et al. ................... | 106/2 |
| 6,153,356 A | * | 11/2000 | Urano et al. ............. | 430/281.1 |
| 6,187,081 B1 | * | 2/2001 | Sures et al. ................... | 106/2 |
| 6,465,146 B1 | * | 10/2002 | Kawamura .................. | 430/138 |
| 2001/0018159 A1 | * | 8/2001 | Maemoto .................... | 430/138 |
| 2001/0046638 A1 | * | 11/2001 | Yanaka et al. .............. | 430/138 |
| 2002/0007751 A1 | * | 1/2002 | Inoue et al. ................ | 101/453 |
| 2002/0033108 A1 | * | 3/2002 | Akiyama et al. ........... | 101/457 |

FOREIGN PATENT DOCUMENTS

| | | |
|---|---|---|
| EP | 0408227 A1 | 1/1991 |
| EP | 0434437 A2 | 6/1991 |
| JP | 09309907 | 12/1997 |

* cited by examiner

*Primary Examiner*—Barbara L. Gilliam
(74) *Attorney, Agent, or Firm*—Burns, Doane, Swecker & Mathis, L.L.P.

(57) ABSTRACT

A lithographic printing plate precursor comprising a hydrophilic support and an image-forming layer containing a heat radical-generating agent, a polymethine dye, and at least one component selected from fine particles containing a compound having a radical polymerizable group and microcapsules encapsulating a compound having a radical polymerizable group.

8 Claims, No Drawings

LITHOGRAPHIC PRINTING PLATE PRECURSOR

FIELD OF THE INVENTION

The present invention relates to a lithographic printing plate precursor. More particularly, the invention relates to a lithographic printing plate precursor capable of plate-making by scanning exposure based on digital signals, having high-sensitivity and good press life, capable of giving printed matters having no stains, and capable of printing by being mounted on a printing machine as it is without being developed.

BACKGROUND OF THE INVENTION

Recently, many investigations have been made with regard to printing plates for a computer to plate system as the rapid technical progress in this field. In these investigations, as a lithographic printing plate precursor aiming at more rationalizing process and solving the waste solution treatment problem, a lithographic printing plate precursor capable of printing by being mounted on a printing machine as it is without being development processed after exposure has been investigated and various methods have been proposed.

As one of the methods of omitting processing steps, there is a method called on-machine development wherein an exposed printing plate precursor is mounted on a cylinder of the printing machine and while rotating the cylinder by supplying a fountain solution and an ink, a non-image area of the printing plate precursor is removed. That is, the method is a system in which after exposing a printing plate precursor, the printing plate precursor is mounted on a printing machine as it is and processing is finished in an ordinary printing step.

The lithographic printing plate precursor suitable for such an on-machine development is required to have a photosensitive layer soluble in a fountain solution and an ink solvent and also has a light-room handle ability suitable for being developed on a printing machine placed in a light room.

For example, in Japanese Patent No. 2938397, a lithographic printing plate precursor having formed on a hydrophilic support a photosensitive layer having fine particles of a thermoplastic hydrophobic polymer dispersed in a hydrophilic binder polymer is disclosed. In the patent, it is described that after exposing the lithographic printing plate precursor by an infrared laser to form images by coalescing the fine particles of the thermoplastic hydrophobic polymer by heat, the lithographic printing plate precursor having formed the images is mounted on a cylinder of a printing machine and can be subjected to an on-machine development by a fountain solution and/or ink.

Also, in JP-A-9-127683 (the term "JP-A" as used herein means an "unexamined published Japanese patent application") and WO 99/10186, it is described that after coalescing thermoplastic fine particles, a printing plate can be prepared by on-machine development.

However, in the method of forming images by welding, etc., of fine particles by heat as described above, there is a problem that the sensitivity is low or good press life is hard to obtain.

SUMMARY OF THE INVENTION

Accordingly, an object of the invention is to solve the problem, that is, to provide a lithographic printing plate precursor having a good on-machine developing property and having high sensitivity and good press life.

Other objects of the invention will become apparent from the following description.

As the result of making earnest investigations for attaining the above-described object, the present inventors have found that the problems of the above-described prior art technique are overcome by employing the following constructions.

That is, the present invention is as follows.

(1) A lithographic printing plate precursor comprising a hydrophilic support and an image-forming layer containing a heat radical-generating agent, a polymethine dye, and at least one component selected from fine particles containing a compound having a radical polymerizable group and microcapsules encapsulating a compound having a radical polymerizable group.

(2) The lithographic printing plate precursor described in item (1), wherein the fine particles containing a compound having a radical polymerizable group or the microcapsules encapsulating a compound having a radical-generating polymerizable group contains at least one of the heat radical-generating agent and the polymethine dye.

(3) The lithographic printing plate precursor described in item (1) or (2), wherein the heat radical-generating agent is an onium salt.

(4) The lithographic printing plate precursor described in item (1) or (2), wherein the polymethine dye is a cyanine dye.

DETAILED DESCRIPTION OF THE INVENTION

The lithographic printing plate precursor of the invention can form images by a scanning exposure based on digital signals. When heat is applied to the hydrophilic image-forming layer by image-exposure, a reaction of the polymer fine particles having a radical polymerizable group or the microcapsules encapsulating a compound having a radical polymerizable group with the heat radical-generating agent and the polymethine dye occurs in the layer, so that the printing plate precursor shows a good on-machine developing property, high sensitivity, and excellent press life due to increase in film strength of the image area heated.

Now, the lithographic printing plate precursor of the invention is described in detail.

First, the image-forming layer, which is the feature of the lithographic printing plate precursor of the invention, is described.

(Image-Forming Layer)
(Compound Having Radical Polymerizable Group)

The compound having a radical polymerizable group used in the invention is a radical polymerizable compound having at least one ethylenically unsaturated double bond, and is selected from the compounds each having at least one, and preferably at least two terminal ethylenically unsaturated band. Such compounds are widely known in the field of art, and they can be used without particular restriction in the invention. They have chemical forms of, for example, monomers, prepolymers such as dimers or trimers, oligomers, polymers or copolymers. They may be used singly or as a mixture of two or more thereof.

In the case of using the polymer or the copolymer, an ethylenically unsaturated double bond such as a (meth) acryloyl group, a vinyl group or an allyl group may be introduced at polymerization or by utilizing a polymer reaction after polymerization.

Examples of the monomer and the copolymer thereof include unsaturated carboxylic acids (e.g., acrylic acid, methacrylic acid, itaconic acid, crotonic acid, isocrotonic acid, maleic acid, etc.), the esters and the amides thereof, and preferably include the esters of the unsaturated carboxylic acids and aliphatic polyhydric alcohols and the amides of the unsaturated carboxylic acids and aliphatic polyvalent amine compounds. Also, the addition reaction products of unsaturated carboxylic acid esters or amides having a nucleophilic substituent such as a hydroxyl group, an amino group or a mercapto group with monofunctional or polyfunctional isocyanates, and the dehydrocondensation reaction products of unsaturated carboxylic acid esters or amides having a nucleophilic substituent with monofunctional or polyfunctional carboxylic acids are suitably used. Also, the addition reaction products of unsaturated carboxylic acid esters or amides having an electrophilic substituent such as an isocyanate group or an epoxy group with monofunctional or polyfunctional alcohols, amines or thiols; and the substitution reaction products of the unsaturated carboxylic acid esters having a releasable substituent such as a halogen group or a tosyloxy group with monofunctional or polyfunctional alcohols, amines or thiols are suitable. Further, as other examples, the compounds obtained by using unsaturated phosphonic acids or styrene in place of the above-described unsaturated carboxylic acids can be used.

Specific examples of the radical polymerizable compounds, which are the esters of aliphatic polyhydric alcohols and the unsaturated carboxylic acids, include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, etc.; methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)-phenyl] dimethylmethane, bis[p-(methacryloxyethoxy)phenyl]-dimethylmethane, etc.; itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.; crotonic acid esters such as ethylene glycol dicrotonate, tetramethylene glycol dicrotonate, pentaerythritol dicrotonate, sorbitol tetradicrotonate, etc.; isocrotonic acid esters such as ethylene glycol diisocrotonate, pentaerythritol diisocrotonate, sorbitol tetraisocrotonate, etc.; maleic acid esters such as ethylene glycol dimaleate, triethylene glycol dimaleate, pentaerythritol dimaleate, sorbitol tetramaleate, etc.

As other examples of the esters, for example, the aliphatic alcohol-base esters described in JP-B-46-27926 (the term "JP-B" as used herein means an "examined Japanese patent publication"), JP-B-51-47334 and JP-A-57-196231; the esters having an aromatic skeleton described in JP-A-59-5240, JP-A-59-5241 and JP-A-2-226149; the esters having an amino group described in JP-A-1-165613 are suitably used.

Specific examples of the monomers of the amides of aliphatic polyvalent amines and the unsaturated carboxylic acids include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, xylylene bismethacrylamide, etc.

As examples of other preferred amide-base monomers, there are the monomers having a cyclohexylene structure described in JP-B-54-21726.

Also, a urethane-base addition polymerizable compound produced using an addition reaction of isocyanate and a hydroxyl group is suitable and as specific examples of such a compound, there are the vinylurethane compounds having at least two polymerizable vinyl groups in one molecule obtained by adding the vinyl monomer containing a hydroxyl group shown by the following formula (I) to a polyisocyanate compound having at least two isocyanate groups in one molecule described, for example, in JP-B-48-41708.

$$CH_2=C(R^{01})COOCH_2CH(R^{02})OH \qquad \text{Formula (1)}$$

wherein, $R^{01}$ and $R^{02}$ each represents H or $CH_3$.

Also, the urethane acrylates as described in JP-A-51-37193, JP-B-2-32293 and JP-B-2-16765; and the urethane compounds having an ethylene oxide-base skeleton described in JP-B-58-49860, JP-B-56-17654, JP-B-62-39417 and JP-B-62-39418 are suitable.

Furthermore, the radical polymerizable compounds having an amino structure or a sulfide structure in the molecule described in JP-A-63-277653, JP-A-63-260909 and JP-A-1-105238 may be used.

As other examples, there are the polyester acrylates as described in JP-A-48-64183, JP-B-49-43191 and JP-B-49-30490; and polyfunctional acrylates and methacrylates such as epoxy acrylates obtained by reacting epoxy resins with (meth) acrylic acid. Also, there are the specific unsaturated compounds described in JP-B-46-43946, JP-B-1-40337 and JP-B-1-40336; and the vinylphosphonic acid-base compounds described in JP-A-2-25493. Also, as the case may be, the structures having a perfluoroalkyl group described in JP-A-61-22048 are suitably used. Furthermore, the photosetting monomers and oligomers described in "Journal of Nippon Adhesive Society", Vol. 20, No. 7, pages 300 to 308 (1984) can be used.

In the invention, the above-described compound having a radical polymerizable group is added to the image-forming layer as the fine particles containing the compound or the microcapsules encapsulating the compound.

The fine particles containing the compound having a radical polymerizable group are obtained, for example, by a solvent evaporation method of the compound having a radical polymerizable group singly or as a mixture of two or more thereof is dissolved in a water-insoluble organic solvent, mixing the solution with an aqueous solution containing a dispersing agent followed by emulsification, and then evaporating the organic solvent by heating to solidify into fine particle form, although the invention is not limited to the method.

Also, in the invention, the fine particles containing at least one of the infrared absorption dye and heat radical-generating agent together with the compound having a radical polymerizable group are suitably used. Such fine particles are obtained by dissolving the compound having a radical polymerizable group together with the infrared absorption dye, the heat radical-generating agent, an organic solvent-soluble polymer, etc., and carrying out the solvent evaporation method.

As a method of preparing the microcapsules encapsulating the compound having a radical polymerizable group, a known method can be applied. For example, as the production method of microcapsules, there are the method of utilizing a coacervation described in U.S. Pat. Nos. 2,800,457 and 2,800,458; the method by an interfacial polymerization as described in British Patent 990,443, U.S. Pat. No. 3,287,154, JP-B-38-19574, JP-B-42-446 and JP-B-42-711; the method by the deposition of a polymer described in U.S. Pat. Nos. 3,418,250 and 3,660,304; The method of using an isocyanate polyol wall material described in U.S. Pat. No. 3,796,669; the method of using an isocyanate wall material described in U.S. Pat. No. 3,914,511; the method of using a urea-formaldehyde-base or urea-formaldehyde-resorcinol-base wall material described in U.S. Pat. Nos. 4,001,140, 4,087,376, and 4,089,802; the method of using the wall material such as a melamine-formaldehyde resin, hydroxy cellulose, etc., described in U.S. Pat. No. 4,025,445; the in situ method by a monomer polymerization described in JP-B-36-9163 and JP-B-51-9079; the spray drying method described in British Patent 930,422 and U.S. Pat. No. 3,111,407; and the electrolytic dispersion cooling method described in British Patents 952,807 and 967,074. However, the production method of the microcapsules in the invention is not limited to these methods.

The preferred microcapsule walls used in the invention have a three dimensional crosslinkage and a property of being swelled with a solvent. From such a viewpoint, as the wall material of the microcapsules, polyurea, polyurethane, polyester, polycarbonate, polyamide, and a mixture thereof are preferred. Particularly, polyurea and polyurethane are preferred.

In the microcapsules of the invention, at the production thereof, a solvent, which dissolves the contents and swells the wall material of the microcapsules, can be added to the dispersion medium. By the solvent, the diffusion of the involved compound(s) to the outside the microcapsules is accelerated.

The selection of such a solvent depends upon the dispersion medium of the microcapsules, the material of the microcapsule wall, the wall thickness, and the content(s). However, an appropriate solvent can be easily selected from many commercially available solvents. For example, in the case of water-dispersible microcapsules made of, crosslinked polyurea or polyurethane walls, as the solvent, alcohols, ethers, acetals, esters, ketones, polyhydric alcohols, amides, amines, fatty acids, etc., are preferred.

Specific examples of the solvent include methanol, ethanol, tertiary butanol, n-propanol, tetrahydrofuran, methyl lactate, ethyl lactate, methyl ethyl ketone, propylene glycol monomethyl ether, ethylene glycol diethyl ether, ethylene glycol monomethyl ether, γ-butyl lactone, N,N-dimethylformamide, and N,N-dimethylacetamide, but the invention is not limited thereto. These solvents may be used singly or as a mixture of two or more thereof.

Also, a solvent, which is not dissolved in the dispersion of the microcapsules but is dissolved when it is mixed with the above-described solvent, can be used.

The addition amount of the solvent is determined by the combination of materials used. When the addition amount is less than an appropriate value, the image formation becomes insufficient, and when the addition amount is more than the appropriate value, the stability of the dispersion is deteriorated. The addition amount is usually effect in the range of from 5 to 95% by weight, preferably from 10 to 90% by weight, and more preferably from 15 to 85% by weight to the dispersion.

The mean particle size of the fine particles and the microcapsules containing the compound having a radical polymerizable group described above is preferably from 0.01 to 3.0 μm, more preferably from 0.05 to 2.0 μm, and more preferably from 0.08 to 1.0 μm. In the range of the mean particle size, good resolution and good stability with the passage of time are obtained.

The addition amount of the fine particles or the microcapsules is preferably at least 50% by weight, more preferably at least 60% by weight, based on a solid content of the image-forming layer. In the range of the addition amount, not only good on-machine developing property but also good sensitivity and press life are obtained.

(Heat Radical-Generating Agent)

The heat radical-generating agent means a compound, which generates a radical by heat energy and initiates and accelerates the polymerization of the compound having polymerizable unsaturated group. As the heat radical-generating agent used in the invention, known thermal polymerization initiators and compounds having a bond of small bond dissociation energy can be selectively used. Examples of the heat radical-generating agent include onium salts, triazine compounds having a trihalomethyl group, peroxides, azo polymerization initiators, azide compounds, quinonediazide compounds, and metallocene compounds, but the following onium salts are preferred because of high sensitivity.

The onium salts preferably used in the invention include diazonium salts, iodonium salts, sulfonium salts, ammonium salts, pyridinium salts, etc., and of these onium salts, iodonium salts, diazonium salts, and sulfonium salts are preferably used.

In the invention, the onium salts function not as acid-generating agents but as the initiators of ionic radical polymerization. The onium salts, which are preferably used in the invention, are those represented by the following formulae (II) to (IV):

$$Ar^{11}\text{—}I^+\text{—}Ar^{12}\ Z^{11-} \qquad (II)$$

$$Ar^{21}\text{—}N^+\text{=}N\ Z^{21-} \qquad (III)$$

$$\begin{array}{c} R^{31} \\ \diagdown \\ S^+\text{—}R^{33}\ Z^{31-} \\ \diagup \\ R^{32} \end{array} \qquad (IV)$$

In the formula (II), $Ar^{11}$ and $Ar^{12}$ each independently represents an aryl group having not more than 20 carbon atoms, which may have a substituent. When the aryl group has a substituent, the preferred substituent includes a halogen atom, a nitro group, an alkyl group having not more than 12 carbon atoms, an alkoxy, group having not more than 12 carbon atoms, and an aryloxy group having not more than 12 carbon atoms. $Z^{11-}$ represents a counter ion selected from the group consisting of a halogen ion, a perchlorate ion, a tetrafluoroborate ion, hexafluorophosphate ion and a sulfonate ion, and is preferably a perchlorate ion, hexafluorophosphate ion or an arylsulfonate ion.

In the formula (III), $Ar^{21}$ represents an aryl group having not more than 20 carbon atoms, which may have a substituent. The preferred substituent includes a halogen atom, a nitro group, an alkyl group having not more than 12 carbon atoms, an alkoxy group having not more than 12 carbon atoms, an aryloxy group having not more than 12 carbon atoms, an alkylamino group having not more than 12 carbon atoms, a dialkylamino group having not more than 12 carbon atoms, an arylamino group having not more than 12 carbon atoms, and a diarylamino group having not more than 12 carbon atoms. $Z^{21-}$ represents a counter ion having the same meaning as defined for $Z^{11-}$.

In the formula (IV), $R^{31}$, $R^{32}$ and $R^{33}$, which may be the same or different, each represents a hydrocarbon group having not more than 20 carbon atoms, which may have a substituent. The preferred substituent includes a halogen atom, a nitro group, an alkyl group having not more than 12 carbon atoms, an alkoxy group having not more than 12 carbon atoms, and an aryloxy group having not more than 12 carbon atoms. $Z^{31-}$ represents a counter ion having the same meaning as defined for $Z^{11-}$.

Specific examples of the onium salts ([OI-1] to [OI-10]) represented by the formula (II), the onium salts ([ON-1] to [ON-5]) represented by the formula (III), and the onium salts ([OS-1] to [OS-6]) represented by the formula (VI), which can be preferably used in the invention, are illustrated below but the onium salts used in the invention are not limited thereto.

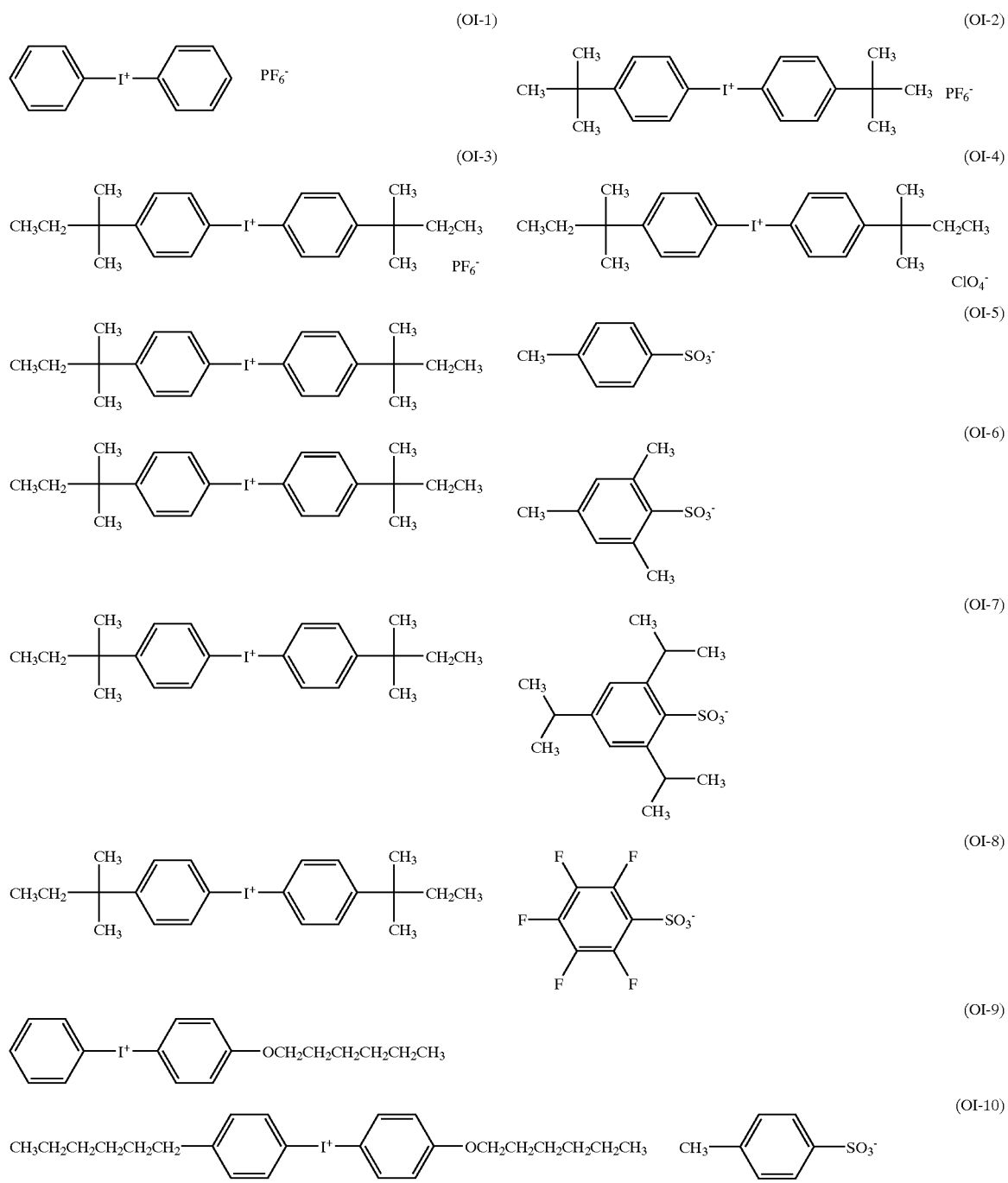

-continued
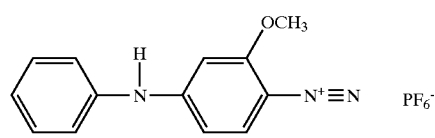 (ON-1)
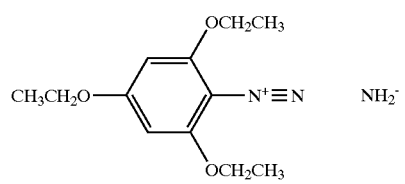 (ON-2)
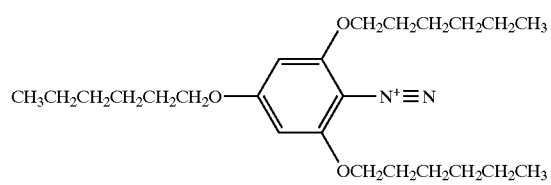 (ON-3)
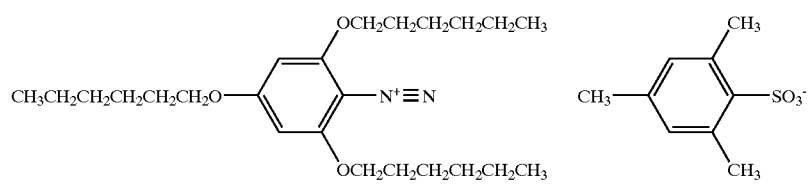 (ON-4)
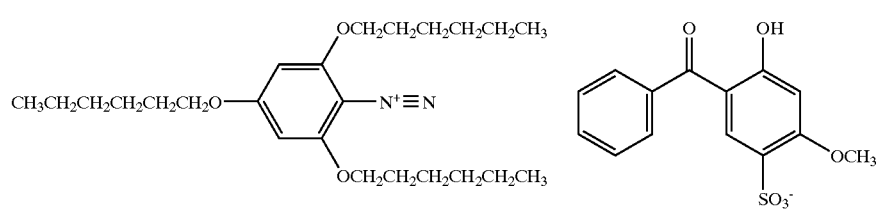 (ON-5)
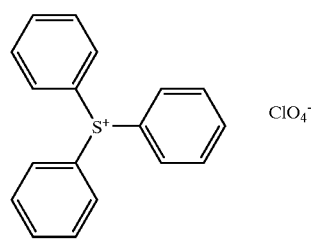 (OS-1)
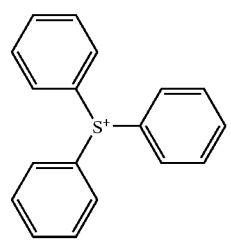 (OS-2)
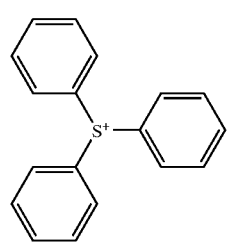 (OS-3)
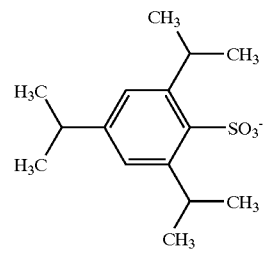  (OS-4)

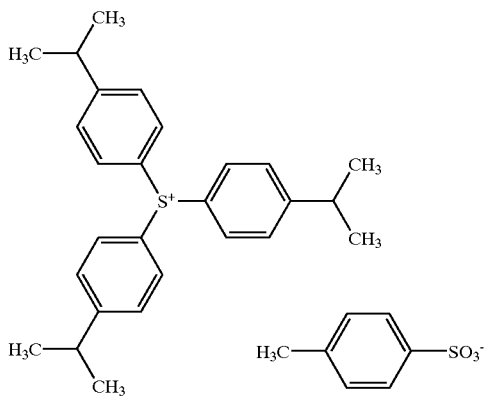

(OS-5)

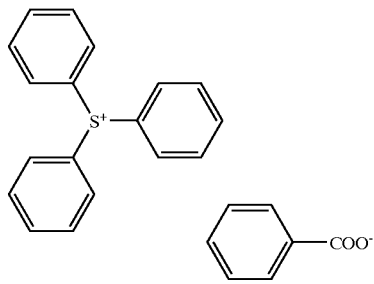

(OS-6)

The onium salt used in the invention has the maximum absorption wavelength of preferably not longer than 400 nm, and more preferably not longer than 360 nm. By defining the absorption wavelength to the ultraviolet region as described above, the image-recording material can be handled under a white lamp.

The onium salt can be added to the image-recording material in an amount of from 0.1 to 50% by weight, preferably from 0.5 to 30% by weight, and particularly preferably from 1 to 20% by weight to the total solid content of the image-recording material. When the addition amount is less than 0.1% by weight, the sensitivity is lowered, and when the addition amount exceeds 50% by weight, stains occur in the non-image areas at printing. These onium salts may be used singly or as a mixture of two or more kinds thereof. Also, the onium salt(s) may be incorporated into the fine particles or the microcapsules described above. In this case, water-insoluble onium salt(s) are preferred and in the case of not incorporating into the fine particles or the microcapsules, water-soluble onium salt(s) can be used.

(Infrared Absorber)

In the invention, as an infrared absorber, a polymethine dye, for example, a cyanine dye or a (thio)pyrylium dye, from the viewpoints of the absorption wavelength aptitude, solubility, stability and image-forming property. A polymethine dye is generally a cation dye wherein the chromophore has a positive charge, but a betaine-type dye having also a negative charge in the chromophore, a squarylium skeleton or a croconium skeleton is incorporated into a polymethine chain can be used.

As the cyanine dye, a cyanine dye having the partial structure shown by the following formula (V) is more preferred.

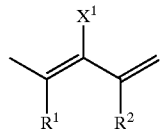

(V)

In the formula, $R^1$ and $R^2$ each independently represents a hydrogen atom or a hydrocarbon group having from 1 to 12 carbon atoms, or $R^1$ and $R^2$ may be bonded to each other to form a ring structure. As the ring formed, a 5-membered ring or a 6-membered ring is particularly preferred.

In the formula, $X^1$ represents a halogen atom or a substituent shown by the following formulae (VI) to (IX).

$$X^2-L^1 \quad\quad (IV)$$

wherein $X^2$ represents an oxygen atom or a sulfur atom; and $L^1$ represents a hydrocarbon atom having from 1 to 12 carbon atoms.

$$\begin{array}{c} L^2 \\ -N \\ L^3 \end{array} \quad\quad (VII)$$

wherein $L^2$ and $L^3$, which may be the same or different, each represents an aromatic hydrocarbon group having from 6 to 10 carbon atoms, which may have a substituent, an alkyl group having from 1 to 8 carbon atoms, a hydrogen atom, or $L^2$ and $L^3$ may bonded to each other to form the ring of the following structure.

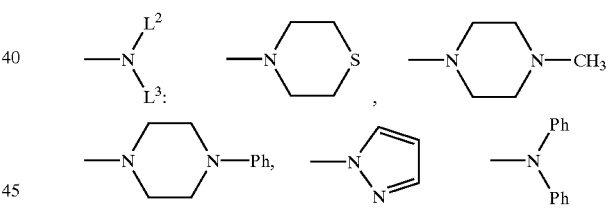

The aromatic hydrocarbon group such as a phenyl group, etc., is preferred for $L^2$ or $L^3$.

$$-S-L^4 \quad\quad (VIII)$$

In the above formula, $L^4$ represents a monocyclic or polycyclic heterocyclic group having at least one of a nitrogen atom, an oxygen atom and a sulfur atom, and is preferably the heterocyclic group selected from the group consisting of a thiazole-base, a benzothiazole-base, a naphthothiazole-base, a thianaphtheno-7',6',4,5-thiazole-base, an oxazole-base, a benzoxazole-base, a naphthoxazole-base, a selenazole-base, a benzoselenazole-base, a naphthoselenazole-base, a thiazoline-base, a 2-quinoline-base, a 4-quinoline-base, a 1-isoquinoline-base, a 3-isoquinoline-base a benzimidazole-base, a 3,3-dialkylbenzindolenine-base, a 2-pyridine-base, a 4-pyridine-base, a 3,3-dialkylbenz[e]indole-base, a tetrazole-base, a triazole-base, a pyrimidine-base, and a thiadiazole-base. As the particularly preferable heterocyclic groups, there are those having the following structures:

$L^4$:

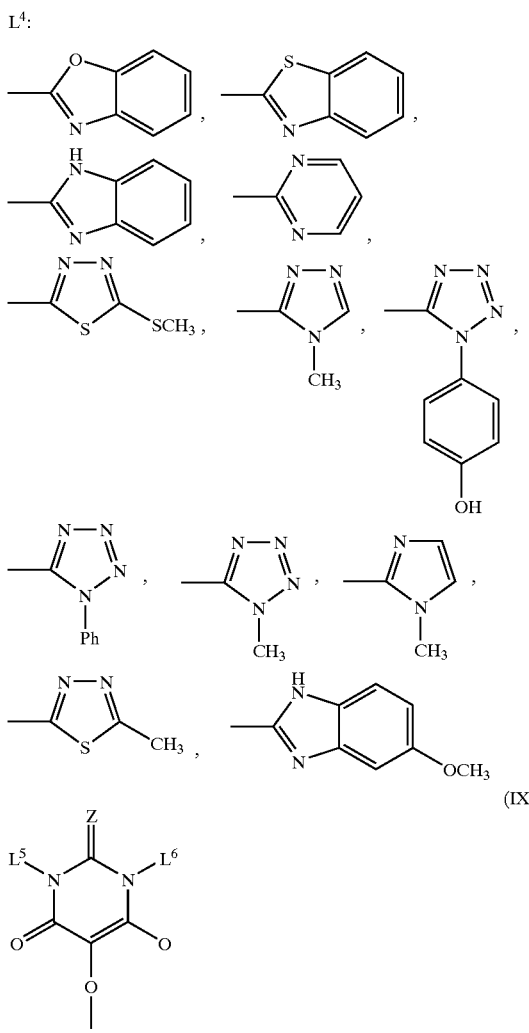

(IX)

In the formula (IX), $L^5$ and $L^6$, which may be the same or different, each represents a hydrogen atom, an allyl group, a cyclohexyl group or an alkyl group having from 1 to 8 carbon atoms; and Z represents an oxygen atom or a sulfur atom.

Of the cyanine dyes having the partial structure shown by formula (V) described above, which are preferably used in the invention, from the viewpoints of the absorption wavelength aptitude, etc., a heptamethinecyanine dye shown by the following formula (X) having an indolenine skeleton, a benzindolenine skeleton, a benzothiazole skeleton, a benzoxazole skeleton or a benzoselenazole skeleton is particularly preferred.

(X)

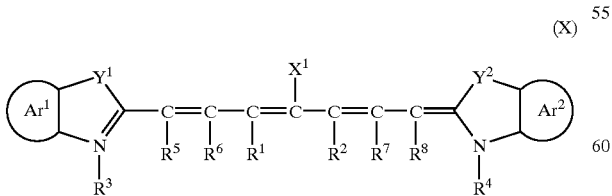

In formula (X), $X^1$, $R^1$, and $R^2$ have the same meanings as defined in formula (V) above, respectively. $Ar^1$ and $Ar^2$, which may be the same or different, each represents an aromatic hydrocarbon group which may has a substituent. Preferred examples of the aromatic hydrocarbon group include a benzene ring and a naphthalene ring. Preferred examples of the substituent include a hydrocarbon group having not more than 12 carbon atoms, a halogen atom, an alkoxy group having not more than 12 carbon atoms, a carboxyl group and a sulfo group. $Y^1$ and $Y^2$, which may be the same or different, each represents an oxygen atom, a sulfur atom, a selenium atom or a dialkylmethylene group having not more than 12 carbon atoms. $R^3$ and $R^4$, which may be the same or different, each represents a hydrocarbon group having not more than 20 carbon atoms, which may has a substituent. Preferred examples of the substituent include an alkoxy group having not more than 12 carbon atoms, a carboxyl group and a sulfo group. $R^5$, $R^6$, $R^7$ and $R^8$, which may be the same or different, each represents a hydrogen atom or a hydrocarbon group having not more than 12 carbon atoms. From the standpoint of availability of the raw materials, a hydrogen atom is preferred. $Z^{1-}$ represents a counter anion. However, when one of $R^1$ to $R^8$ is substituted with a sulfo group, $Z^{1-}$ is unnecessary. From the standpoint of storage stability of the coating solution of image-forming layer, $Z^{1-}$ is preferably a halogen ion, a perchlorate ion, a tetrafluoroborate ion, a hexafluorophosphate ion and a sulfonate ion, and particularly preferably a perchlorate ion, a hexafluorophosphate ion and an arylsulfonate ion.

As other dyes having betaine-type skeleton, there are dyes shown by the following structural formulae (XI) and (XII).

(XI)

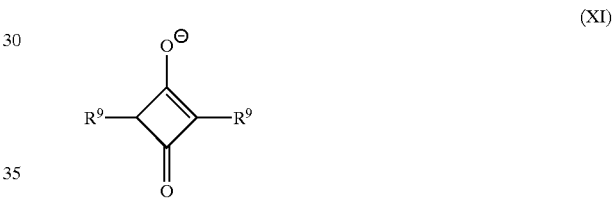

wherein $R^9$ represents a substituent of each of the following structures, wherein $R^{14}$ and $R^{15}$ each represents an alkyl group having from 1 to 8 carbon atoms; and $Y^3$ represents an oxygen atom or a sulfur atom.

$R^9$:

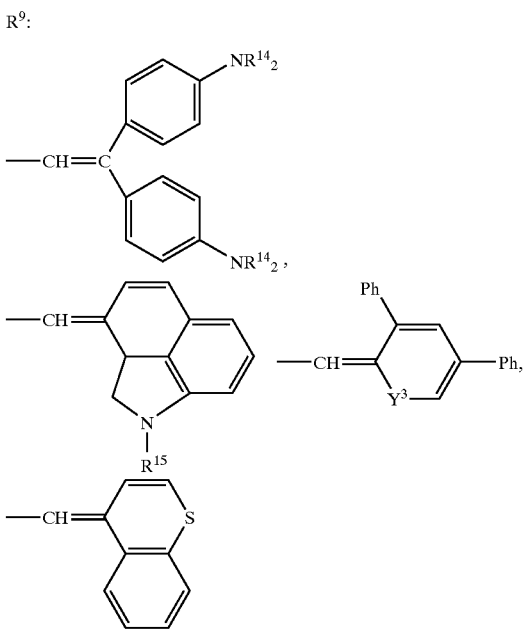

-continued

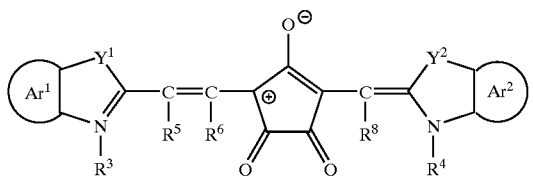
(XII)

wherein, $R^1$ to $R^8$, $Ar^1$, $Ar^2$, $Y^1$ and $Y^2$ have the same meanings as defined in formula (X) above.

Of the dyes having the chromophore as described above, the cyanine dyes having the partial structure shown by formula (V) are preferred, and of these cyanine dyes, the heptamethinecyanine dyes shown by formula (X) are particularly preferred.

The above-described infrared absorbers can be produced according to known organic synthesis techniques. Specific synthesis methods are described in U.S. Pat. No. 5,441,866, "Zh. Org. Khim.", Vol. 28, No. 10, pages 2159 to 2164 (1992) and European Patent (EP) 464,543 A1.

Of these infrared absorbers, light-heat converting agents, which are preferably added to a hydrophilic matrix of a hydrophilic resin in the image-forming layer, are water-soluble dyes and specific examples thereof are illustrated below.

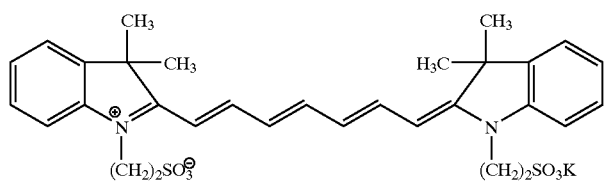
(IR-1)

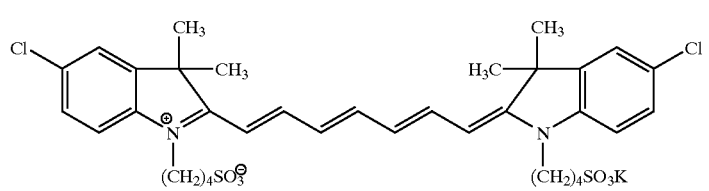
(IR-2)

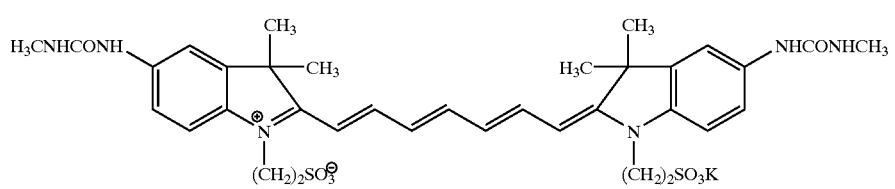
(IR-3)

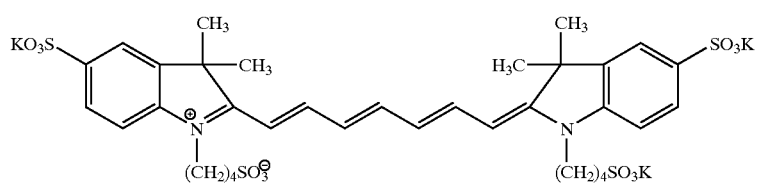
(IR-4)

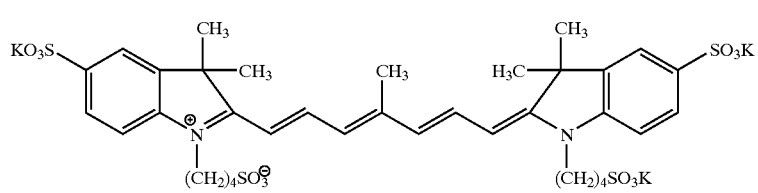
(IR-5)

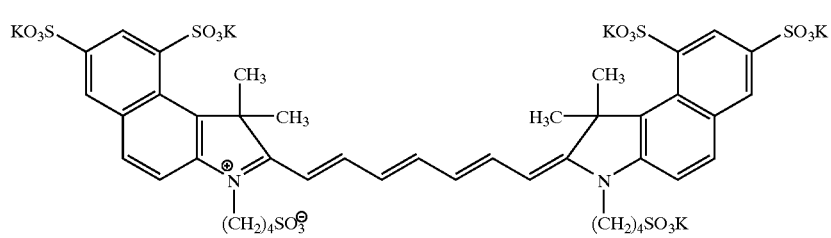
(IR-6)

-continued
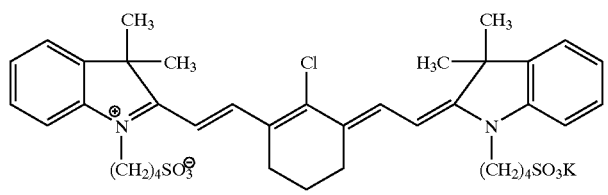 (IR-7)
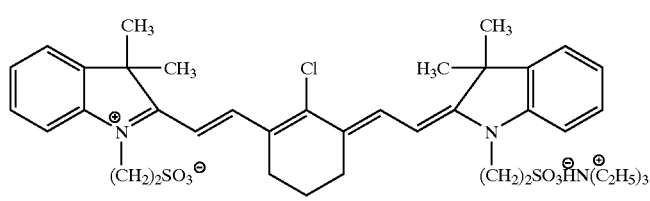 (IR-8)
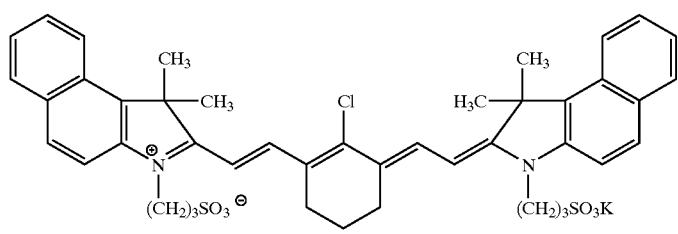 (IR-9)
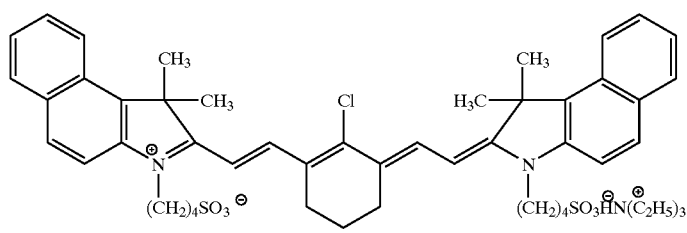 (IR-10)
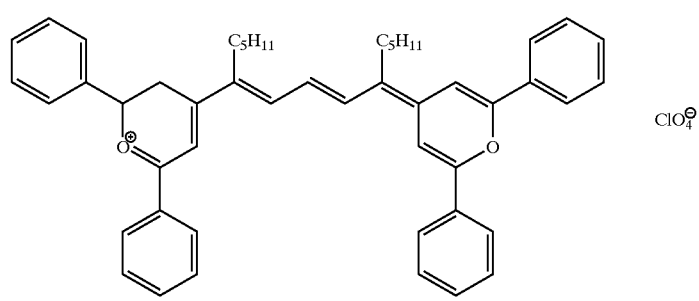 (IR-11)
The light-heat converting agents, which are preferably added to the fine particles or microcapsules in the image-forming layer of the invention, may be the above-described infrared absorption dyes, but lipophilic dyes are more preferred.
Specific examples of the lipophilic dyes include the following dyes.
IR21

-continued
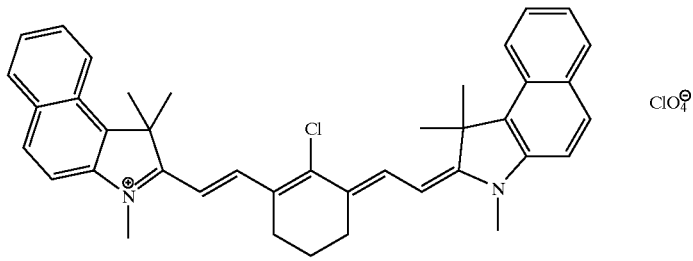
IR22
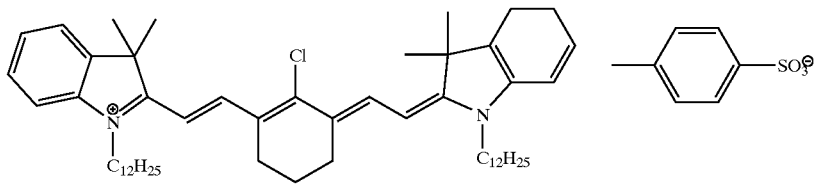
IR23
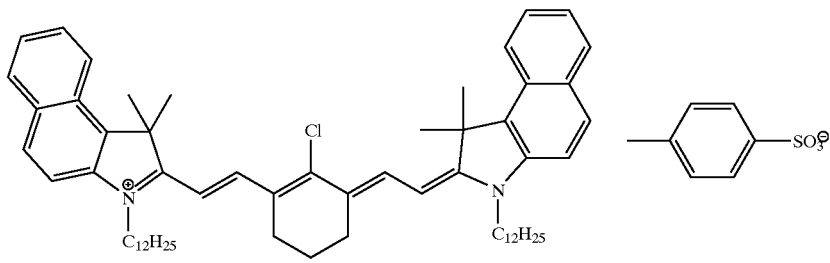
IR24
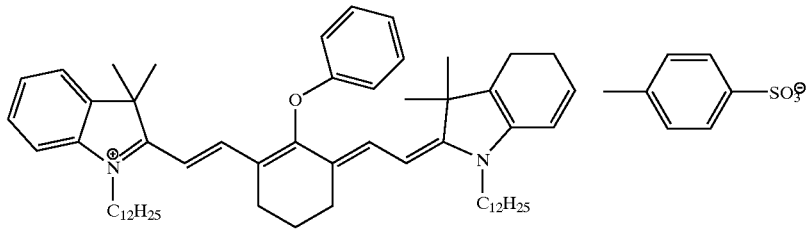
IR25
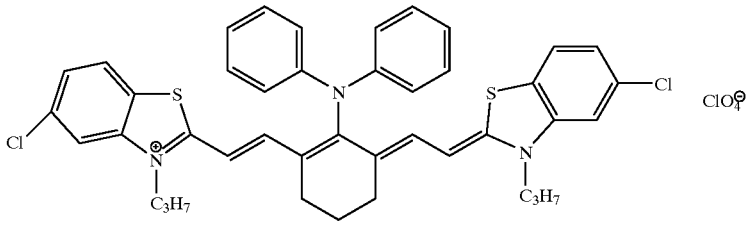
IR26
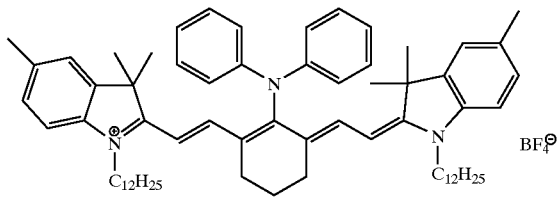
IR27

-continued

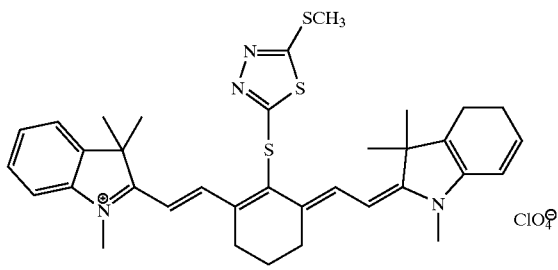
IR28

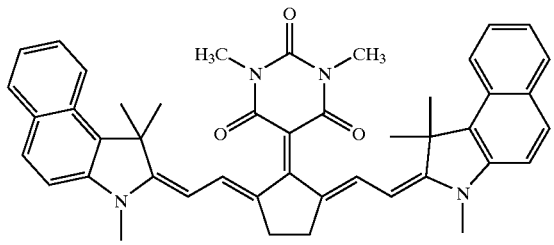
IR29

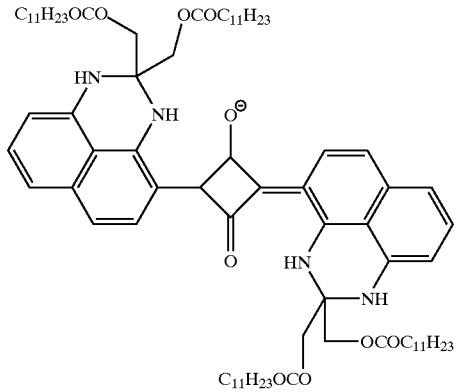
IR30

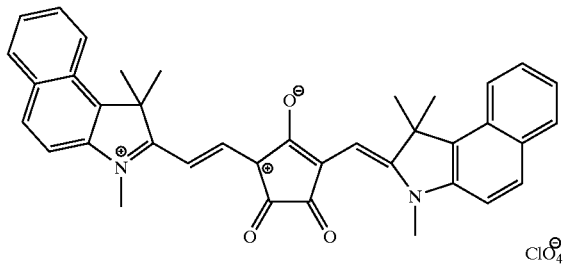
IR31

(Hydrophilic Resin)

The image-forming layer of the invention contains a hydrophilic resin for improving the on-machine developing property and the film strength of the image-forming layer itself.

As the hydrophilic resin, that having a hydrophilic group, for example, a hydroxyl group, a carboxyl group, a phosphoric acid group, a sulfonic acid group or an amido group is preferred. Because the image strength is increased by reacting the hydrophilic resin with a vinyloxy group to crosslink, thereby improving the press life, the hydrophilic resin having a functional group reacting with the vinyloxy group, for example, a hydroxyl group, a carboxyl group, a phosphoric acid group or a sulfonic acid group is also preferred. The hydrophilic resin having a hydroxyl group or a carboxyl group is more preferred.

Specific examples of the hydrophilic resin include gum arabic, casein, gelatin, starch derivatives, Soya gum (water-soluble soy polysaccharide), hydroxypropyl cellulose, methyl cellulose, carboxymethyl cellulose and sodium salt thereof, cellulose acetate, sodium alginate, vinyl acetate-malic acid copolymers, styrene-maleic acid copolymers, polyacrylic acids and salt thereof, polymethacrylic acids and salt thereof, homopolymer and copolymers of hydroxyethyl methacrylate, homopolymer and copolymers of hydroxyethyl acrylate, homopolymer and copolymers of hydroxypropyl methacrylate, homopolymer and copolymers of hydroxypropyl acrylate, homopolymer and copolymers of hydroxybutyl methacrylate, homopolymer and copolymers of hydroxybutyl acrylate, polyethylene glycols, hydroxypropylene polymers, polyvinyl alcohols, hydrolyzed polyvinyl acetate having a hydrolysis degree of at least 60% by weight, preferably at least 80% by weight, polyvinylformal, polyvinylpyrrolidone, homopolymer and copolymers of acrylamide, homopolymer and copolymers of methacrylamide, homopolymer and copolymers of N-methylol acrylamide, homopolymer and copolymers of 2-acrylamide-2-methyl-1-propanesulfonic acid, and homopolymer and copolymers of 2-methacryloyloxyethylphosphonic acid.

Also, the above-described hydrophilic resin may be used after crosslinking to the extent capable of developing the non-exposed area on a printing machine. The crosslinking agent used in the invention includes, for example, an aldehyde such as glyoxal, a melamine-formaldehyde resin, a urea-formaldehyde resin, etc; a methylol compound such as N-methylolurea, N-methylolmelamine, a methylolated polyamide resin, etc.; an active vinyl, compound such as divinylsulfone, bis(β-hydroxyethylsulfonic acid), etc.; an epoxy compound such as epichlorohydrin, polyethylene glycol diglycidyl ether, polyamide, polyamine, epichlorohydrin addition products, a polyamide epichlorohydrin resin, etc.; an ester compound such as monochloroacetic acid ester, thioglycolic acid ester, etc.; a polycarboxylic acid such as polyacrylic acid, a methyl vinyl ether/maleic acid copolymer, etc.; an inorganic crosslinking agent such as boric acid, titanyl sulfate, Cu salt, Al salt, Sn salt, V salt, Cr salt, etc.; and a modified polyimide resin.

Furthermore, a crosslinking catalyst, for example, ammonium chloride, a silane coupling agent or a titanate coupling agent can be used together.

(Other Additives)

In the image-forming layer, for easily distinguishing the image area and the non-image area after the image formation, a dye having a large absorption in the visible light region can be used as a coloring agent. Specific examples of the dye include Oil Yellow #101, Oil yellow #103, Oil pink #312, Oil Green BG, Oil Blue BOS, Oil Blue #603, Oil Black BY, and Oil Black T-505 (manufactured by Orient chemical Industries, Ltd.), Victoria Pure Blue, Crystal Violet (C142555), Methyl Violet (C142535). Ethyl Violet, Rhodamine B (C1145170B), Malachite Green (CI42000), Methylene Blue (CI52015), and the dyes described in JP-A-62-293247. Also, a pigment, for example, phthalocyanine-base pigment, azo-base pigment or titanium oxide can be suitably used. The addition amount of coloring agent is preferably from 0.01 to 10% by weight based on the total solid content of the coating solution for image-forming layer.

To the image-forming layer of the invention, a plasticizer can be added for imparting softness to the coated film, if desired. For example, polyethylene glycol, tributyl citrate, diethyl phthalate, dibutyl phthalate, dihexyl phthalate, dioctyl phthalate, tricresyl phosphate, tributyl phosphate, trioctyl phosphate or tetrahydrofurfuryl oleate is used.

For forming the image-forming layer of the invention, a coating liquid is prepared by dissolving or dispersing the above-described necessary components in a solvent and coated on a support. The solvent used includes ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene and water, although the solvent used in the invention is not limited thereto. The solvents are used singly or as a mixture thereof. The concentration of the solid content in the coating solution is preferably from 1 to 50% by weight.

A coating amount (solid content) of the image-forming layer on the support after coating and drying may be varied depending upon the use, but is preferably from 0.2 to 5.0 $g/m^2$. As a coating method, various methods can be used. For example, there are bar coater coating, rotary coating, spray coating, curtain coating, dip coating, air knife coating, blade coating and roll coating.

To the coating solution for image-forming layer of the invention can be added a surface active agent, for example, a fluorine-base surface active agent as described in JP-A-62-170950 for improving the coating property. The addition amount of surface active agent is preferably from 0.01 to 1% by weight, more preferably from 0.05 to 0.5% by weight, based on the total solid content of the image-forming layer.

(Overcoat Layer)

In the lithographic printing plate precursor of the invention, a water-soluble overcoat layer can be provided on the image-forming layer for preventing the surface of image-forming layer from contamination due to lipophilic substances. The water-soluble overcoat layer used in the invention can be easily removed at printing and contains a resin selected from water-soluble organic high-molecular compounds. The water-soluble organic high-molecular compound used is a compound; wherein the coated film formed by coating and drying has a film-forming faculty. Specific examples of the compound include polyvinyl acetate (having, however, the hydrolysis ratio of at least 65%), polyacrylic acid and alkali metal salt or amine salt thereof, a polyacrylic acid copolymer and alkali metal salt or amine salt thereof, polymethacrylic acid and alkali metal salt or amine salt thereof, a polymethacrylic acid copolymer and alkali metal salt or amine salt thereof, polyacrylamide and copolymer thereof, polyhydroxyethyl acrylate, polyvinylpyrrolidone and copolymer thereof, polyvinyl methyl ether, a vinyl methyl ether/maleic anhydride copolymer, poly-2-acrylamido-2-methyl-1-propanesulfonic acid and alkali metal salt or amine salt thereof, a poly-2-acrylamido-2-methyl-1-propanesulfonic acid copolymer and alkali metal salt or amine salt thereof, gum arabic, a cellulose derivative (for example, carboxymethyl cellulose, carboxyethyl cellulose and methyl cellulose) and modified product thereof, white dextrin, pullulan, and enzyme-decomposed etherified dextrin. According to the purposes, two or more kinds of these resins can be used as a mixture thereof.

As the polymer used for the water-soluble overcoat layer, the above-described polar-converted polymers are particularly preferred in view of increasing the resistance of image area to a fountain solution and thus improving the press life.

The overcoat layer may also contain the above-described water-soluble infrared absorption dye. Furthermore, in the case of aqueous coating solution, the overcoat layer may contain a nonionic surface active agent, for example, polyoxyethylene nonyl phenyl ether, polyoxyethylene dodecyl ether for the purpose of ensuring the uniformity of coating.

The dry coated amount of overcoat layer is preferably from 0.1 to 2.0 $g/m^2$. Within such a range of the dry coated amount, contamination due to lipophilic substances, for example, attachment of fingerprint, on the surface of image-forming layer can be effectively prevented without deteriorating the on-machine developing property.

(Support)

In lithographic printing plate precursor of the invention, the support capable of coating thereon the above-described image-forming layer is a dimensionally stable plate-form material, and examples thereof include paper, paper laminated with a plastic (e.g., polyethylene, polypropylene or polystyrene), a metal plate (e.g., aluminum, zinc or copper), a plastic film (e.g., cellulose diacetate, cellulose triacetate, cellulose propioname, cellulose butyrate, cellulose acetate butyrate, cellulose nitrate, polyethylene terephthalate, polyethylene, polystyrene, polypropylene, polycarbonate or polyvinyl acetal), and paper or plastic film laminated or vapor-deposited with the metal as described above. A polyester film and an aluminum plate are preferably used.

The aluminum plate includes a pure aluminum plate, an aluminum alloy plate containing a very small amount of foreign element(s) and a plate formed by laminating a plastic on a thin aluminum or aluminum alloy plate. Examples of the foreign element contained in the aluminum alloy include iron, manganese, copper, magnesium, chromium, zinc, bismuth, nickel and titanium. The content of the foreign element in the aluminum alloy is not more than 10% by weight. The aluminum plate may be an aluminum plate from aluminum ingot obtained by using a DC casting method or an aluminum plate from aluminum ingot obtained by a continuous casting method. The aluminum plate used in the invention can also be appropriately selected from aluminum plates hitherto known and used.

A thickness of the support used in the invention is from 0.05 mm to 0.6 mm, preferably from 0.1 mm to 0.4 mm, and particularly preferably from 0.15 mm to 0.3 mm.

Prior to use the aluminum plate, it is preferred to apply a surface treatment such as surface graining, anodizing (anodic oxidation), etc. By the surface treatment, hydrophilic property of the surface is improved and it becomes easy to ensure adhesion to the image-forming layer.

The graining treatment of surface of aluminum plate can be conducted using various methods, for example, a method of mechanically graining, a method of graining by electrochemically dissolving the surface of aluminum plate, and a method of selectively chemically dissolving the surface of aluminum plate.

As the mechanical graining method, known methods, e.g., a ball graining method, a brush graining method, a blast graining method or a buff graining method can be used. As the chemical graining method, a method of dipping an aluminum plate in a saturated aqueous solution of aluminum salt of mineral acid as described in JP-A-54-31187 is suitable. As the electrochemical graining method a method of graining in an electrolyte containing an acid such as hydrochloric acid or nitric acid by applying an alternating current or a direct current is used. Also, an electrolytic graining method using a mixed acid as described in JP-A-54-63902 can be utilized.

It is preferred that the graining treatment by the method as described above is conducted in an extent that the centerline average roughness (Ra) of the surface of aluminum plate becomes in the range of from 0.2 to 1.0 µm.

The surface grained aluminum plate is, if desired, subjected to an alkali etching treatment using an aqueous solution of potassium hydroxide or sodium hydroxide, etc., and then subjected to a neutralizing treatment. Thereafter, the plate is subjected to an anodizing treatment for increasing the abrasion resistance, if desired.

As the electrolyte, which is used for the anodizing treatment of aluminum plate, various electrolytes forming a porous oxide film can be used. Ordinarily, sulfuric acid, hydrochloric acid, oxalic acid, chromic acid, or a mixture thereof is used. The concentration of electrolyte is appropriately determined depending on the kind of electrolyte.

The treatment conditions cannot be generally determined since the conditions variously change depending on the kind of electrolyte used. Usually, however, it is suitable that the concentration of electrolyte is from 1 to 80% by weight, the solution temperature is from 5 to 70° C., a current density is from 5 to 60 A/dm$^2$, an electric voltage is from 1 to 100 V, and the electrolytic time is in the range of from 10 seconds to 5 minutes.

An amount of the anodized film formed is preferably from 1.0 to 5.0 g/m$^2$, and particularly preferably from 1.5 to 4.0 g/m$^2$.

As the support used in the invention, the substrate subjected to the surface treatment and having the anodized film as described above may be used as it is. However, for more improving the adhesion with the upper layer, hydrophilic property, resistance to stain, heat-insulating property, etc., other treatments, for example, enlarging treatment of micropores of the anodized film as described in Japanese Patent Application Nos. 2000-65219 and 2000-143387, sealing treatment of micropores, and surface hydrophilic treatment of immersing in an aqueous solution containing a hydrophilic compound can be appropriately selectively applied to the substrate, if desired.

Suitable examples of hydrophilic compound for the above-described surface hydrophilic treatment include polyvinylphosphonic acid, a compound having a sulfonic acid group, a saccharide compounds, citric acid, an alkali metal silicate, potassium zirconium fluoride and a phosphate/inorganic fluorine compound.

In the case of using a support having an insufficient hydrophilic property, for example, a polyester film, as the support of the invention, it is desirable to coat a hydrophilic layer thereon to make the surface hydrophilic. As the hydrophilic layer, a hydrophilic layer formed by coating a coating solution containing a colloid of an oxide or hydroxide of at least one element selected from beryllium, magnesium, aluminum, silicon, titanium, boron, germanium, tin, zirconium, iron, vanadium, antimony, and a transition metal described in Japanese Patent Application No. 2000-10810 is preferred of these hydrophilic layers, a hydrophilic layer formed by coating a coating solution containing a colloid of silicon oxide or silicon hydroxide is preferred.

In the invention, before coating the image-forming layer, for example, an inorganic under coating layer of a water-soluble metal salt such as zinc borate, etc., described in Japanese Patent Application No. 2000-143387 or an organic under coating layer containing, for example, carboxymethyl cellulose, dextrin, polyacrylic acid may be provided on the support, if desired.

The under coating layer may also contain the above-described infrared absorption dye.

(Plate-Making and Printing)

On the lithographic printing plate precursor of the invention, images are formed by heat. Specifically, direct imagewise recording by a thermal recording head, a scanning exposure by an infrared laser, a high-illuminance flash exposure by a xenon discharge lamp, an infrared lamp exposure, etc., are used. Exposure by a solid high-output infrared laser, for example, a semiconductor laser emitting an infrared ray of wavelength of from 700 to 1200 nm or YAG laser is preferably used.

The image-exposed lithographic printing plate precursor of the invention is mounted on a printing machine without any other processes and subjected to printing by an ordinary procedure using ink and a fountain solution.

Also, as a simple lithographic printing system without using a fountain solution, lithographic printing using emulsion ink described, for example, in JP-B-49-26844, JP-B-49-27124, JP-B-49-27125, JP-A-53-36307, JP-A-53-36308, JP-B-61-52867, JP-A-58-211484, JP-A-53-27803, JP-A-53-29807, JP-A-54-146110, JP-A-57-212274, JP-A-58-37069 and JP-A-54-106305 can be used.

The lithographic printing plate precursor can be, after mounting on a printing machine cylinder, exposed by a laser loaded on the printing machine, and then subjected to on-machine development by supplying a fountain solution and/or ink.

Also, the lithographic printing plate precursor can be developed using water or an appropriate aqueous solution as a developer, and then subjected to printing.

The present invention will be described in greater detail with reference to the following examples, but the present invention should not be construed as being limited thereto.

(Production Example of Support)

The melt of a JIS A1050 alloy containing at least 99.5% of aluminum, 0.30% of Fe, 0.10% of Si, 0.02% of Ti, and 0.013%, of Cu was subjected to a cleaning treatment and cast. For tile cleaning treatment, a degassing treatment for removing unnecessary gases such as hydrogen, etc., in the melt, and a ceramic tube filter treatment was carried out. The casting was carried out by a DC casting method. The surface of the solidified ingot having a plate thickness of 500 mm was ground by 10 mm from the surface and the ingot plate was subjected to a homogenization treatment at 550° C. for 10 hours such that the intermetallic compound was not coarsened. Then, the ingot was hot rolled at 400° C., annealed in a continuous annealing furnace at 500° C. for 60 seconds, and subjected to cold rolling to form an aluminum rolled plate having a thickness of 0.30 mm. By controlling the roughness of the rolling roller, the centerline average surface roughness Ra of the aluminum plate after cold rolling was adjusted to 0.2 $\mu$m. Theieafter, for improving the plane property, the plate was subjected to treatment with a tension leveler.

Then, the surface treatment for forming a lithographic printing plate support was carried out.

First, for removing rolling oil on the surface of the aluminum plate a degreasing treatment was carried out with a 10% aqueous solution of sodium aluminate at 50° C. for 30 seconds and then neutralization and desmut treatments were carried out with a 30% aqueous solution of sulfuric acid at 50° C. for 30 seconds Then, for improving the adhesion between the support and the image-forming layer and also imparting a water-holding property to non-image areas, a so-called graining treatment of roughening the surface of the support was carried out. An aqueous solution containing 1% nitric acid and 0.5% aluminum nitrate was maintained at 45° C., while passing the aluminum web through the aqueous solution, by applying an anode side quantity of electricity of 240° C./dm$^2$ at a current density of 20 A/dm$^2$ and an AC wave-form of a duty ratio of 1:1 by an indirect electric power supply cell, electrolytic graining was carried out. Thereafter, an etching treatment was conducted in a 10% aqueous solution of sodium aluminate at 50° C. for 30 seconds, and neutralization and desmut treatments were carried out with a 30% aqueous solution of sulfuric acid at 50° C. for 30 seconds.

For further improving the abrasion resistance, chemical resistance, and water-holding property, an oxide film was formed on the surface of support by anodizing treatment. Specifically, using a 20% aqueous solution of sulfuric acid as an electrolyte at 35° C., while passing the aluminum web through the electrolyte, an electrolytic treatment was carried out at a direct current of 14 A/dm$^2$ by an indirect electric power cell to form an anodized film of 2.5 g/m$^2$.

Thereafter, for ensuring the hydrophilic property in the non-image area of the printing plate, a silicate treatment was carried out. Specifically, a 1.5% aqueous solution of #3 sodium silicate was maintained at 70° C., the aluminum web was passed through the aqueous solution so that the contact time of the aluminum web with the solution became 15 seconds and then washed with water. The amount of Si attached was 10 mg/m$^2$. The centerline surface roughness Ra of the support thus-prepared was 0.25 $\mu$m.

<Synthesis of Radical Polymerizable Group-containing Polymer P-1>
(Synthesis of Monomer M-1)

To a solution of 260.3 g of hydroxyethyl methacrylate in 1,000 ml of tetrahydrofuran was added dropwise 253.9 g of 3-chloropropionic chloride to react.

To the reaction solution was added water, after neutralization with potassium carbonate, the reaction product was extracted with ethyl acetate and the extract was purified by distillation to obtain Monomer M-1. (Yield 92%)

(Synthesis of Radical Polymerizable Group-containing Polymer P-1)

A mixed solution of 68 g of Monomer M-1 described above, 7.9 g of methacrylic acid, 140 ml of propylene glycol monomethyl ether and 0.5 g of Initiator V-65 was raised to 70° C. with stirring under nitrogen gas atmosphere to react for 4 hours. After cooling, to the solution were added 500 ml of propylene glycol monomethyl ether and then 81 g of triethylamine, followed by stirring for one hour. Further, 100 ml of concentrated hydrochloric acid and 100 ml of water were added dropwise to the solution. The precipitates were collected by filtration and purified obtain Polymer P-1 containing a methacryloyl group.

<Synthesis of Radical Polymerizable Group-containing Polymer P-2>

To a mixed solution of 12.2 g of poly-p-hydroxystyrene (weight average molecular weight: 8,000), 15.5 g of 2-methacryloyloxyethyl isocyanate and 500 ml of tetrahydroxyfuran was added 10 g of triethylamine, and the mixture was raised to 70° C. with stirring, followed by the reacting for 3 hours.

After cooling, the solution was reprecipitated with water and the precipitates were collected and purified to obtain Polymer P-2 having a methacryloyl group. The introduction rate of methacryloyl group obtained by NMR was 80 equivalent %.

(Synthesis Example of Fine Particles (1))

In a mixture of 7.4 g of methyl ethyl ketone and 13.7 g of ethyl acetate were dissolved 6 g of Polymer P-1 described above, 1.5 of an infrared absorber (IR-24 described hereinbefore), 0.6 g of a radical-generating agent (OI-5 described hereinbefore) and 0.1 g of an anionic surface active agent (Paionin A-41C, manufactured by Takemoto Oil and Fat Co., Ltd.) to prepare an oil phase solution. The oil phase solution was mixed with 53 g of a 1.8% aqueous solution of polyvinyl alcohol (PVA 205, manufactured by Kuraray Co., Ltd.) as an aqueous phase solution, and the mixture was emulsion-dispersed by a homogenizer at 15,000 rpm for 10 minutes. Then, while stirring the emulsified dispersion at 40° C. for 3 hours, methyl ethyl ketone and ethyl acetate were evaporated off. The solid content concentration of the resulting fine particle dispersion was 15.4% by weight. The mean particle size of the fine particles was 0.30 $\mu$m.

(Synthesis Example of Fine Particles (2))

In the same manner as in Synthesis Example of Fine Particles (1) except for using Polymer P-2 (weight average molecular weight: 8,000) described above in place of Polymer P-1, a dispersion of Fine Particle (2) was synthesized. The solid content concentration of the resulting fine particle dispersion was 15.3%. The mean particle size of the fine particles was 0.2 $\mu$m.

(Synthesis Example of Fine Particles (3))

In a mixture of 7.4 g of methyl ethyl ketone and 13.7 g of ethyl acetate were dissolved 5.5 g of an allyl methacrylate/methyl methacrylate copolymer (copolymerization ratio: 70/30, weight average molecular weight: 15,000), 1.5 g of an infrared absorption dye (IR-24 described hereinbefore), 0.5 g of dipentaerythritol hexaacrylate (KAYARAD DPHA, manufactured by Nippon Kayaku Co., Ltd.), 0.6 g of a radical-generating agent (OI-5 described hereinbefore) and 0.1 g of an anionic surface active agent (Paionin A-41C, manufactured by Takemoto Oil and Fat Co., Ltd.) to prepare an oil phase solution, The solution was mixed with 53 g of a 1.8% aqueous solution of polyvinyl alcohol (PVA 205, manufactured by Kuraray Co., Ltd.) as an aqueous phase component, and the mixture was emulsion-dispersed by a homogenizer at 15,000 rpm for 10 minutes. Then, while stirring the emulsified dispersion at 40° C. for 3 hours, methyl ethyl ketone and ethyl acetate were evaporated off. The solid content concentration of the resulting fine particle dispersion was 15.3% by weight. The mean particle size of the fine particles was 0.35 μm.

(Synthesis Example of Fine Particles (4): Containing No Radical-generating Agent)

In the same manner as in Synthesis Example of Fine Particles (1) except that the radical-generating agent was not added, a dispersion of Fine Particles (4) was synthesized. The solid content concentration of the resulting fine particle dispersion was 14.3%. The mean particle size of the fine particles was 0.25 μm.

(Synthesis Example of Fine Particles (5): Containing No Infrared Absorber)

In the same manner as Synthesis Example of Fine Particles (1) except that the infrared absorber was not added, a dispersion of Fine Particles (4) was synthesized. The solid content concentration of the resulting fine particle dispersion was 13.0%. The mean particle size of the fine particles was 0.20 μm.

(Synthesis Example of Fine Particles (6): Containing No Polymerizable Group)

In the same manner as in Synthesis Example of Fine Particles (1) except for using polymethyl methacrylate (weight average molecular weight: 15,000) in placed of Polymer P-1, a dispersion of Fine Particles (6) was synthesized. The solid content concentration of the resulting fine particle dispersion was 13.4%. The mean particle size of the fine particles was 0.50 μm.

(Synthesis of Fine Particles (7): for Comparison, Using Infrared Absorber Other than Cyanine)

In the same manner as in Synthesis Example of Fine Particles (1) except for using an infrared absorber (IR-41) described below in place of the infrared absorber (IR-24), a dispersion of Fine Particles (7) was synthesized. The solid content concentration of the resulting fine particle dispersion was 15.3%. The mean particle size of the fine particles was 0.32 μm.

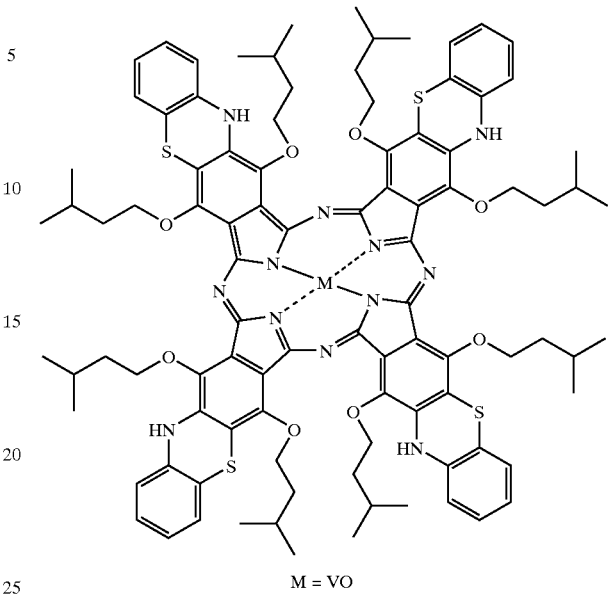

IR-41

M = VO (Synthesis Example of Microcapsules (1))

In a mixture of 30 g of methyl ethyl ketone and 60 g of ethyl acetate were dissolved 40 g of a 50% ethyl acetate solution of adduct of trimethylolpropane and xylylene diisocyanate (Takenate D-110N, manufactured by Takeda Chemical Industries, Ltd.,) (for microcapsule wall material), 25 g of dipentaerythritol hexaacrylate (KAYARAD DPHA, manufactured by Nippon Kayaku Co., Ltd.), 3 g of an infrared absorption dye (IR-24 described hereinbefore), 2.5 g of a radical-generating agent (OI-5 described hereinbefore) and 0.1 g of Paionin A-41C to prepare an oil phase component. As an aqueous phase component, 120 g of a 4% aqueous solution of PVA 205 was prepared. The oil phase component and the aqueous component were emulsified using a homogenizer at 10,000 rpm for 10 minutes. Then, 200 g of water was added to the emulsion, and the mixture was stirred at room temperature for 30 minutes and further at 40° C. for 3 hours. The solid content concentration of the microcapsule liquid thus obtained was 15.5% by weight and the mean particle size of the microcapsules was 0.35 μm.

(Synthesis Example of Microcapsules (2))

In a mixture of 30 g of methyl ethyl ketone and 60 g of ethyl acetate were dissolved 40 g of a 50% ethyl acetate solution of adduct of trimethylolpropane and xylylene diisocyanate (Takenate D-110N, manufactured by Takeda Chemical Industries, Ltd.,) (for microcapsule wall material), 10 g of dipentaerythritol hexaacrylate (KAYARAD DPHA, manufactured by Nippon Kayaku Co., Ltd.), 15 g of an allyl methacrylate/methyl methacrylate copolymer (copolymerization ratio: 70/30, weight average molecular weight: 15,000), 3 g of an infrared absorption dye (IR-24 described hereinbefore), 2.5 g of a radical-generating agent (OI-5 described hereinbefore) and 0.1 g of Paionin A-41C to prepare an oil phase component. As an aqueous phase component, 120 g of a 4% aqueous solution of PVA 205 was prepared. The oil phase component and the aqueous phase component were emulsified using a homogenizer at 10,000 rpm for 10 minutes. Then, 200 g of water was added to the emulsion and the mixture was stirred at room temperature for 30 minutes and further at 40° C. for 3 hours. The solid component concentration of the microcapsule liquid thus obtained was 15.3% by weight and the mean particle size of the microcapsules was 0.31 µm.

(Synthesis Example of Microcapsules (3): for Comparison)

In the same manner as in Synthesis of Microcapsules (1) except for using IR-41 described above as the light-heat converting agent, in place of IR-24, Microcapsules (3) were synthesized. The solid content concentration of the microcapsule liquid thus obtained was 15.5% and the mean particle size of the microcapsules was 0.36 µm.

EXAMPLES 1 TO 7 AND COMPARATIVE EXAMPLES 1 TO 4

Coating solutions (1) to (3) for the image-forming layer each containing fine particles selected from Fine Particles (1) to (7) and Microcapsules (1) to (3) described above as shown in Table 1 below were prepared, and each coating solution was coated on the support prepared described above by a bar coating method and dried in an oven under the conditions of 60° C. for 120 seconds to prepare a lithographic printing plate precursor in which the dry coated amount of image-forming layer was 1 g/m².

| Coating solution for image-forming layer (1) | |
| --- | --- |
| Water | 25 g |
| Fine particles or microcapsules | 20 g |
| Coating solution for image-forming layer (2) | |
| Water | 25 g |
| Fine Particles (4) | 20 g |
| Heat radical-generating agent (OS-6) | 0.2 g |
| Coating solution for image-forming layer (3) | |
| Water | 25 g |
| Fine Particles (5) | 20 g |
| Infrared absorber (IR-10) | 0.5 g |

Each of the lithographic printing plate precursors thus obtained was exposed by Trendsetter 3244 VFS (manufactured by Creo Co.) loading a water-cooled 40 W infrared semiconductor laserunder the conditions of output of 9 W, outer surface drum rotation speed of 210 rpm, plate surface energy of 100 mJ/cm², and resolution of 2,400 dpi, and without development processing, mounted on a cylinder of a printing machine (SOR-M, manufactured by Heidelberg Co.). After supplying first a fountain solution and then printing ink, paper was fed to conduct printing. As a insult, with all of the lithographic printing plate precursors, on-machine development could be carried out and printing was possible. Press life (printable numbers of paper) of each lithographic printing plate precursor is shown in Table 1 below.

TABLE 1

| | Coating Solution for Image-Forming Layer | Fine Particles or Microcapsules | Press Life |
| --- | --- | --- | --- |
| Example 1 | (1) | Fine particles (1) | 20,000 |
| Example 2 | (1) | Fine particles (2) | 15,000 |
| Example 3 | (1) | Fine particles (3) | 15,000 |
| Example 4 | (2) | Fine particles (4) | 16,000 |
| Example 5 | (3) | Fine particles (5) | 12,000 |
| Example 6 | (1) | Microcapsules (1) | 13,000 |
| Example 7 | (1) | Microcapsules (2) | 12,000 |

TABLE 1-continued

| | Coating Solution for Image-Forming Layer | Fine Particles or Microcapsules | Press Life |
| --- | --- | --- | --- |
| Comparative Example 1 | (1) | Fine particles (6) | 5,000 |
| Comparative Example 2 | (1) | Fine particles (4) | 5,000 |
| Comparative Example 3 | (1) | Fine particles (7) | 5,000 |
| Comparative Example 4 | (1) | Microcapsules (3) | 6,000 |

EXAMPLE 8

A coating solution for overcoat layer described below was coated on the image-forming layer of Example 1 by a bar coating method and dried in an oven under the conditions of 60° C. for 120 seconds to prepare a lithographic printing plate precursor having a dry coated amount of the overcoat layer of 0.5 g/m².

| Coating solution for overcoat layer | |
| --- | --- |
| Water | 95 g |
| Carboxymethyl cellulose | 5 g |

When the lithographic printing plate precursor thus obtained was exposed and subjected to printing in the same manner as in Example 1, the on-machine development was possible without causing any troubles, and 23,000 prints were obtained.

From the results described above, it can be seen that the lithographic printing plate precursor of the invention using the fine particles containing the compound having a radical polymerizable group or the microcapsules encapsulating the compound having a radical polymerizable group has good press life. Also, when a heat radical-generating agent or a polymethine dye, which is a light-heat converting agent, is incorporated into the fine particles or microcapsules, the lithographic printing plate precursor also shows good press life.

As described above, the lithographic printing plate precursor of the invention can form images by a scanning exposure based on digital signals. Specifically, when heat is added by light exposure, the polymer fine particles having a radical polymerizable group or the microcapsules encapsulating a compound having a radical polymerizable group contained in the hydrophilic image-forming layer cause a reaction with the heat radical-generating agent and the polymethine dye contained in the layer. Thus, the lithographic printing plate precursor shows a good on-machine developing property, high sensitivity, and excellent press life due to increase in the film strength of the image areas heated.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. An on-machine developable lithographic printing plate precursor comprising: a hydrophilic support; and a hydrophilic light-heat conversion image-forming layer soluble in a fountain solution and/or ink, said image-forming layer containing a polymethine dye that absorbs infrared rays and converts the infrared rays to heat, a heat radical-generating agent that generates a radical upon heating, and at least one component selected from fine particles containing a compound having a radical polymerizable group, which is polymerized by the radical generated from the heat radical-generating agent and microcapsules encapsulating a compound having a radical polymerizable group, which is polymerized by the radical generated from the heat radical-generating agent.

2. The lithographic printing plate precursor as claimed in claim 1, wherein the hydrophilic support has an anodized film on the surface and has been subjected to a surface hydrophilic treatment 3. The lithographic printing plate precursor as claimed in claim 2, wherein the surface hydrophilic treatment is conducted with an aqueous solution containing a hydrophilic compound selected from polyvinylphosphonic acid, a compound having a sulfonic acid group, a saccharide compound, citric acid, an alkali metal silicate, potassium zirconium fluoride and a phosphate/inorganic fluorine compound.

4. The lithographic printing plate precursor as claimed in claim 1, wherein the image-forming layer contains a hydrophilic resin.

5. The lithographic printing plate precursor as claimed in claim 1, wherein the heat radical-generating agent is an onium salt.

6. The lithographic printing plate precursor as claimed in claim 1, wherein the polymethine dye is a cyanine dye.

7. The lithographic printing plate precursor as claimed in claim 1, wherein the fine particles and microcapsules are water-dispersible.

8. A lithographic printing method comprising:
supplying a fountain solution and printing ink to an image-exposed on-machine developable lithographic printing plate precursor mounted on a printing machine to dissolve the unexposed portion of the lithographic printing plate precursor and to conduct printing, wherein the on-machine developable lithographic printing plate precursor comprises a hydrophilic support and a hydrophilic light-heat conversion image-forming layer soluble in the fountain solution and/or ink, and the image-forming layer contains a polymethine dye that absorbs infrared rays and converts the infrared rays to heat, a heat radical-generating agent that generates a radical upon heating, and at least one component selected from fine particles containing a compound having a radical polymerizable group, which is polymerized by the radical generated from the heat radical-generating agent and microcapsules encapsulating a compound having a radical polymerizable group, which is polymerized by the radical generated from the heat radical-generating agent.

* * * * *